United States Patent [19]

Seevinck

[11] Patent Number: 4,612,513

[45] Date of Patent: Sep. 16, 1986

[54] DIFFERENTIAL AMPLIFIER

[75] Inventor: Evert Seevinck, Enschede, Netherlands

[73] Assignee: U.S. Philips Corporation, New York, N.Y.

[21] Appl. No.: 707,288

[22] Filed: Mar. 1, 1985

[30] Foreign Application Priority Data

Mar. 13, 1984 [NL] Netherlands ............... 8400790

[51] Int. Cl.$^4$ ............................................. H03F 3/45
[52] U.S. Cl. .................................................. 330/261
[58] Field of Search ............... 330/252, 258, 260, 261

[56] References Cited

U.S. PATENT DOCUMENTS 4,002,993  1/1977  van de Plassche ............... 330/261

FOREIGN PATENT DOCUMENTS 512555  6/1976  U.S.S.R. ............................ 330/260

OTHER PUBLICATIONS

Hearn, "Fast Slewing Monolithic Operational Amplifier", *IEEE Journal of Solid–State Circuits*, vol. SC-6, No. 1, Feb. 1971, pp. 20–24.

Primary Examiner—James B. Mullins
Attorney, Agent, or Firm—Thomas A. Briody; Jack Oisher; William J. Streeter

[57] ABSTRACT

A first and a second transistor ($T_1$, $T_2$) whose emitters are connected to a common point (4) via first resistors ($R_1$, $R_2$), which common point is connected to the positive power-supply terminal via a current source ($I_1$), form a differential amplifier to which an input signal ($V_i$) is applied. In order to increase the slew rate the quiescent current through the first and the second transistor ($T_1$, $T_2$) is made to increase when the input voltage ($V_i$) increases. This is achieved by means of a third transistor ($T_3$) whose emitter is connected to the common point (4). The base of this transistor ($T_3$) is connected to the tapping of a voltage divider which is arranged between the bases of the first and the second transistor ($T_1$, $T_2$) and which comprises second resistors ($R_3$, $R_4$). When the input voltage increases the transistor ($T_3$) drains a continually decreasing portion of the current from the current source ($I_1$).

1 Claim, 2 Drawing Figures

DIFFERENTIAL AMPLIFIER

BACKGROUND OF THE INVENTION

1. Field of the Invention

The invention relates to a differential amplifier comprising a first and a second transistor of the same conductivity type, whose emitters are each connected to a common point via a first resistor, which first resistors are substantially equal to each other, a third transistor which is of the same conductivity type as the first and the second transistor and whose emitter is coupled to the common point, and a current source for supplying the quiescent current of the amplifier, which source is connected to the common point.

2. Description of the Related Art

An important characteristic of differential amplifiers is the so-called "slew rate". This is to be understood to mean the maximum possible rate of change of the output signal of the amplifier in the case of a capacitive load of the differential amplifier. This slew rate is proportional to the maximum current that can be supplied by the collectors of the first and the second transistor, which current is substantially equal to the quiescent current supplied by the current source in the common emitter circuit. If negative feedback is applied by arranging resistors in the emitter lines the transconductance becomes substantially inversely proportional to the resistance value of these resistors, so that the gain becomes substantially independent of the quiescent current. The slew rate may then be increased by increasing the quiescent current. However, the emitter resistors can be made identical to each other with a limited accuracy only, so that an increase of the quiescent current loads to a higher offset voltage and also to a larger offset-voltage drift. Especially for low input voltages this is a disadvantage. A known solution to this problem is to cause the quiescent current of the differential amplifier to increase when the input voltage increases. In a differential amplifier disclosed in U.S. Pat. No. 4,002,993 this is achieved by means of a third transistor whose emitter is connected to the junction point of the emitter resistors. This third transistor is driven by two transistors of a conductivity type opposite to that of the first, the second and the third transistor, the bases of the two transistors being connected to the emitters of the transistors of the differential amplifier and the emitters of the two transistors being connected to the base of the third transistor and to a current source. As a result of this configuration the third transistor drains a substantial portion of the quiescent current of the differential amplifier when the input signals of the differential amplifier are small, the portion of this quiescent current drained by this transistor decreasing as the input signals become larger.

SUMMARY OF THE INVENTION

A disadvantage of this known circuit arrangement is that if the amplifier is not driven the value of the current drained by the third transistor cannot be defined accurately because this value is determined by transistors of the opposite conductivity type, which in general will not have the same characteristics. Therefore, the invention aims at providing a differential amplifier whose quiescent current increases with the input signal, the value of said current being defined accurately in the absence of an input signal. According to the invention a differential amplifier of the type specified in the opening paragraph is characterized in that a voltage divider is arranged between the bases of the first and the second transistor, which voltage divider comprises two substantially identical second transistors, the base of the third transistor being connected to the junction point of said second resistors. In accordance with the invention the current drained by the third transistor is controlled in a very simple manner by means of a voltage divider arranged between the bases of the transistors of the differential amplifier. The current through the third transistor in the absence of an input signal is defined accurately by the resistors and the emitter areas of the three transistors of the same conductivity type.

BRIEF DESCRIPTION OF THE DRAWINGS

The invention will now be described in more detail, by way of example, with reference to the accompanying drawing, in which.

DESCRIPTION OF THE PREFERRED EMBODIMENTS

Figure 1:
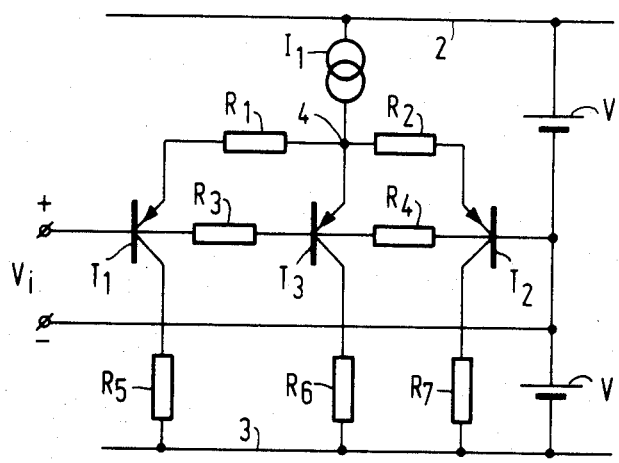
FIG. 1 shows a differential amplifier in accordance with the invention.

FIG. 1 shows a differential amplifier in accordance with the invention which comprises two transistors $T_1$ and $T_2$ whose emitters are connected to a common point 4 via substantially equal resistors $R_1$ and $R_2$. In the present embodiment the collectors of the transistors $T_1$ and $T_2$ are connected to the negative power-supply terminal 3 via a resistor $R_5$ and a resistor $R_7$ respectively. Further, the emitter of a transistor $T_3$ is connected to the common point 4 and the collector of this transistor is connected to the negative power-supply terminal 3 via a resistor $R_6$. The base of transistor $T_3$ is connected to the tapping of a voltage divider which is arranged between the bases of the transistors $T_1$ and $T_2$ and which comprises two substantially identical resistors $R_3$ and $R_4$. The quiescent current for the transistors $T_1$, $T_2$ and $T_3$ is furnished by a current source $I_1$, which is arranged between the positive power-supply terminal 2 and the common point 4. In the present example a symmetrical power supply is obtained between the positive and negative-power supply terminals 2 and 3 by means of two voltage sources V. The signal voltage $V_i$ is applied between the bases of transistors $T_1$ and $T_2$. For an input voltage $V_i=0$ most of the current will flow through transistor $T_3$ owing to the resistors $R_1$ and $R_2$ in the emitter lines of the transistors $T_1$ and $T_2$. The magnitude of the current flowing through said transistor $T_3$ can be calculated from the voltage equation for the closed loop comprising the base-emitter junction of transistor $T_1$, the resistor $R_1$, the base-emitter junction of transistor $T_3$ and the resistor $R_3$ and from the fact that the sum of the currents through the transistors $T_1$, $T_2$ and $T_3$ is equal to the current from the current source $I_1$. For an input voltage $V_1>0$ half this voltage appears on the base of transistor $T_3$ owing to the presence of the voltage divider $R_3$, $R_4$. As a result of this input voltage the current through transistor $T_2$ increases by $V_i/2.(R_2+r_{e2})$ in which $r_{e2}$ is the emitter resistance of transistor $T_2$ and the current through transistor $T_1$ decreases by $V_i/2.(R_1+r_{e1})$, in which $r_{e1}$ is the emitter resistance of transistor $T_1$. The emitter resistance of a transistor is inversely proportional to the current flowing through it. Therefore, the resistance $R_{e2}$ decreases and the resistance $R_{e1}$ increases. If the resistors $R_1$ and $R_2$ are substantially identical, the current through transistor $T_2$ will increase to a greater extent than the current through transistor $T_1$ decreases. As a result of this, the current through transistor $T_3$ decreases. As the input voltage $V_i$ increases further the current through transistor $T_1$ decreases to substantially zero, while the current through transistor $T_2$ continues to increase at the expense of the current through transistor $T_3$ until the full current from the current source $I_1$ flows through transistor $T_2$.

Figure 2:
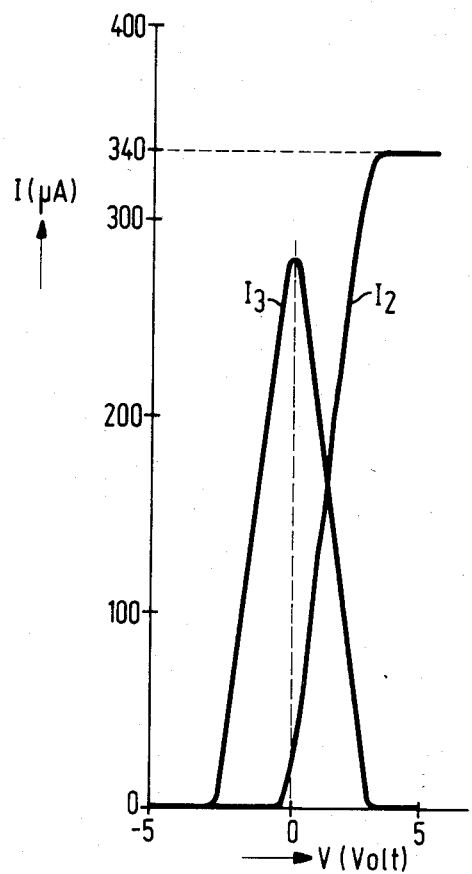
FIG. 2 shows two current-voltage characteristics of the circuit arrangement shown in FIG. 1.

In FIG. 2 the current $I_2$ through transistor $T_2$ and the current $I_3$ through the transistor $T_3$ are plotted as a function of the input voltage $V_i$ for a practical example of the circuit arrangement shown in FIG. 1, the components of the circuit having the following values:

$R_1 = R_2 = 3.9$ kohms
$R_3 = R_4 = 3.9$ kohms
$R_5 = R_6 = R_7 = 1$ ohm
$I_1 = 340$ μA
$V = 30$ V.

The resistors $R_5$, $R_6$ and $R_7$ are 1 ohm because the currents $I_2$ and $I_3$ flowing through these resistors can then be measured by measuring the voltages across these resistors. However, alternatively the collector of transistor $T_3$ may be connected directly to the negative power-supply terminal 3 and/or the collectors of transistors $T_1$ and $T_2$ may be connected to the negative power-supply terminal via loads other than resistors, such as current sources, current mirrors and the like.

For the values given and an input voltage $V_i = 0$ the current $I_1 = 340$ μA is divided so that a current $I_3 = 283$ μA flows through transistor $T_3$ and a current $I_2 = 28$ μA flows through transistor $T_2$ and hence through transistor $T_1$. As will be apparent from the Figure the current $I_3$ through transistor $T_3$ is then a maximum. When the input voltage $V_i$ increases this current decreases to zero, whilst at the same time the current $I_2$ increases until it has become equal to $I_2 = 340$ μA. If the input voltage becomes $V_i \leq 0$, the current $I_2$ will decrease to zero, whilst at the same time the current $I_3$ will decrease owing to the increase of the current through transistor $T_1$.

In the above mentioned numerical example the resistors $R_3$, $R_4$ have the same resistance values as the resistors $R_1$, $R_2$. However, these resistors may also have different values.

What is claimed is:

1. A differential amplifier comprising a pair of input terminals and a first transistor (T1) and a second transistor (T2) of the same conductivity type, whose emitters are each connected to a common point by respective first resistors (R1, R2), which first resistors are substantially equal to each other, the bases of the first and second transistors being connected to said input terminals; a third transistor (T3) which is of the same conductivity type as the first and the second transistors and whose emitter is coupled to the common point; a current source (I1) for supplying the quiescent current of the amplifier, which source is connected to the common point; and a voltage divider arranged between the bases of the first and the second transistors, which voltage divider comprises two substantially identical second resistors (R3, R4), the base of the third transistor being connected to the junction point of said second resistors.

* * * * *